United States Patent
Zakel et al.

(12) 
(10) Patent No.: US 6,285,562 B1
(45) Date of Patent: Sep. 4, 2001

(54) METHOD OF CONTACTING A CHIP

(75) Inventors: Elke Zakel, Falkensee (DE); Joachim Eldring, Phoenix, AZ (US)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 08/860,884
(22) PCT Filed: Oct. 12, 1995
(86) PCT No.: PCT/EP95/04029
 § 371 Date: Sep. 1, 1999
 § 102(e) Date: Sep. 1, 1999
(87) PCT Pub. No.: WO96/20500
 PCT Pub. Date: Jul. 4, 1996

(30) Foreign Application Priority Data

Dec. 23, 1994 (DE) ................................................ 44 46 471

(51) Int. Cl.$^7$ ............................. H05K 1/18; H01L 21/283
(52) U.S. Cl. ..................... 361/768; 29/840; 228/180.22; 257/737; 257/781
(58) Field of Search .................................... 361/749, 751, 361/760, 767, 768, 783, 792; 257/737, 780, 781, 786; 174/254, 260, 262, 266, 268; 29/832, 840, 843, 852; 228/179.1, 180.22

(56) References Cited

U.S. PATENT DOCUMENTS

| 5,641,113 | * | 6/1997 | Somaki et al. | 228/180.22 |
| 5,848,466 | * | 12/1998 | Viza et al. | 29/840 |
| 5,969,418 | * | 10/1999 | Belanger, Jr. | 257/737 |
| 6,097,610 | * | 8/2000 | Hashimoto | 361/760 |

FOREIGN PATENT DOCUMENTS

| 39 17 707 | 6/1990 | (DE) | H01L/21/58 |
| 41 31 413 | 10/1992 | (DE) | H01L/21/60 |
| 0 592 938 | 4/1994 | (EP) | H05K/3/32 |

OTHER PUBLICATIONS

Patent Abstracts of Japan, vol. 9, No. 284 (E–357), Nov. 12, 1985, and JP A, 60 126856 Jul. 6, 1985.
International Journal of Microcircuits and Electronic Packaging, Flip–Chip Attachment of Fine–Pitch GaAs Devices Using Ball–Bumping Technology, J. Eldring et at., 17 (1004) Second Quarter, No. 2, pp 118–126.
43rd ECTC/IEEE, Jun. 1–4, 1993, Buena Vista Palace, Orlando, Florida, USA, D. Chu et al, "A Maskless Flip–Chip Solder Bumping Technique" pp 610–614.
IBM Technical Disclosure Bulletin, vol. 37, No. 7, Jul. 1994, pp 207–208, "Flip–chip Assembly for Improved Thermal Performance".
Patent Abstracts of Japan, E–1451, Oct. 21, 1993, vol. 17/No. 579, Integrated Circuit Element Packaging Device, JP 5–175279 (A).
Patent Abstracts of Japan, E–1451, Oct. 21, 1993, vol. 17/No. 579, Method of Mounting Semiconductor Chip and Mounting Structure, JP 5–175275 (A).
Patent Abstracts of Japan, E–1312, Jan. 27, 1993, vol. 17/No. 44, Method for Mounting Semiconductor Chip, JP 4–259232 (A).
Patent Abstracts of Japan, E–1287, Oct. 30, 1992, vol. 16/No. 530, Semiconductor Device, JP 4–199524 (A).

\* cited by examiner

Primary Examiner—Gerald Tolin
(74) Attorney, Agent, or Firm—Dougherty & Clements LLP

(57) ABSTRACT

In a chip bonding method, first bonding bumps are applied to bonding electrodes of the chip, a first flexible circuit carrier is arranged on the chip, the flexible circuit carrier having cavities which are aligned with the bonding bumps, and second bonding bumps are applied to the first bonding bumps in such a way that bonding areas on the first flexible circuit carrier are in contact with the first and/or second bonding bumps.

13 Claims, 2 Drawing Sheets

METHOD OF CONTACTING A CHIP

FIELD OF THE INVENTION

The present invention refers to a method for bonding chips on a flexible circuit carrier.

BACKGROUND OF THE INVENTION

Flexible circuit carriers consist of a flexible, thin polymer foil with a structured metallization layer as conducting paths. The flexible circuit carriers can be either single-layer or multilayer. Multilayer flexible circuit carriers are provided with contact channels, so-called plated-through holes, which are arranged at right angles to the layers and which connect the individual levels electrically.

Flexible circuit carriers are employed where parts of a system which are movably connected to one another are electrically connected. Examples of this are notebooks or laptops with a hinged screen and collapsible mobile telephones. In the automobile industry, flexible circuit carriers are needed e.g. so that electrical connections entering the engine area can be decoupled from mechanical vibrations, Where space is severely restricted in a geometrically complex housing, circuits implemented on flexible circuit carriers can be matched to the shape of the housing in a space-saving way (3-dimensional design), something that is not possible with rigid printed circuit boards (2-dimensional design).

A bonding technique of the first level (first-level bonding technique) between one or more chips and a flexible circuit carrier is the so-called tape automated bonding (TAB) To realize the advantage of a high number of connections per chip surface, so-called flip-chip technologies have also been used on flexible circuit carriers very recently. Patent Abstracts of Japan, Vol. 9, No. 284 (E-357), Nov. 2, 1985 discloses a method for connecting a flexible substrate to bonding areas of a semiconductor element. In this method the conducting paths on the flexible circuit are each connected with bonding areas of the semiconductor element using a metal ball and compression bonding.

From DE 4131413 A1 a bonding method for semiconductor chips is known wherein a first gold ball, a second gold ball and a lead ball are used per bonding site to apply a chip to a substrate by means of a flip-chip bonding method.

SUMMARY OF THE INVENTION

It is the object of the present invention to provide a chip bonding method which enables chips to be bonded on a flexible circuit carrier while requiring a minimal amount of space.

The present invention provides a method for mounting a chip on a flexible circuit carrier, comprising the method steps of:

a) applying first bonding bumps to bonding electrodes of the chip;

b) arranging a first flexible circuit carrier, provided with at least one bonding area, on the chip, the flexible circuit carrier having cavities which are aligned with the bonding bumps and which extend through the first flexible circuit carrier and at least one bonding area on the first flexible circuit carrier; and c) after step b), applying second bonding bumps to the first bonding bumps such that at least one bonding area on the first flexible circuit carrier is in contact with at least one of the first or second bonding bumps.

It is another object of the present invention to provide an electronic circuit for which chips are bonded on a flexible circuit carrier with a minimum of space being needed.

The present invention provides an electronic circuit comprising at least one chip with bonding electrodes on which first bonding bumps are arranged, a first flexible circuit carrier, which comprises a carrier foil and a bonding area arranged on the same, with cavities which are aligned with the first bonding bumps which are arranged on the at least one chip; and second bonding bumps, which are arranged on the first bonding bumps in such a way that the bonding area of the first flexible circuit carrier is in contact with the first and/or second bonding bumps.

An advantage of the present invention is that a space-saving bonding of a chip while using traditional wire-bond devices becomes possible.

According to a further advantage, the present invention makes short signal paths possible for chips with peripheral electrode arrangement (i.e. for chips for which the electrodes are arranged at the edge of the chip) and for chips with an electrode configuration in a planar arrangement (the so-called area configuration) without using a flip-chip bonder.

In addition, the present invention makes possible multilayer bondings without using a multilayer substrate.

Yet another advantage of the present invention is that the bonding of the chips is performed at relatively low temperatures (max. 200° C., such temperatures being common for wire bonding and ball bumping), no forces here being exerted on the carrier foil by the bonding process.

BRIEF DESCRIPTION OF THE DRAWINGS

Preferred embodiments of the present invention will be described in more detail below, making reference to the drawings enclosed in which.

DESCRIPTION OF THE PREFERRED EMBODIMENTS OF THE INVENTION

Figure 1:
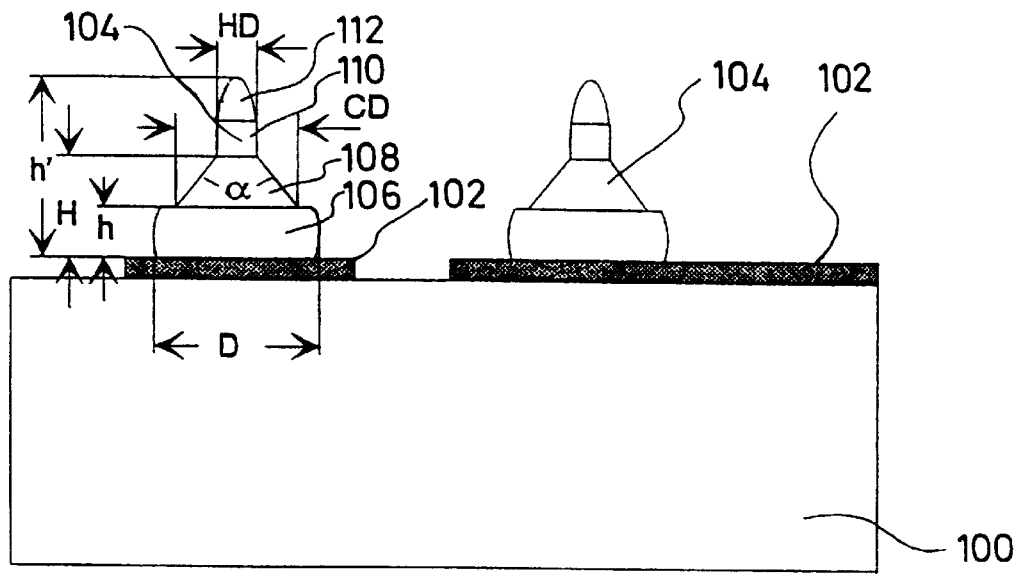
FIG. 1 shows a chip on which bonding bumps are arranged.

The chip bonding method according to the present invention will now be described in more detail on the basis of FIGS. 1 to 3. In the figures, corresponding elements are designated by the same reference numeral.

In a first step, the bonding electrodes 102 (pads) of a chip 100 which is to be bonded are provided with mechanically created bonding bumps 104 (ball bumps). The structure resulting from the first method step is shown in FIG. 1.

The mounted bonding bumps 104 may be made e.g. of gold, copper or palladium It is obvious that the bonding bumps 104 may also be manufactured from a solder material, such as e.g. PbSn, InSn, SnAg.

The geometrical dimensions of the bonding bumps 104 may depend both on the geometry of the tool employed to mount the bonding bumps 104 on the bonding electrodes 102 and on the bonding parameters and may be altered via the same.

In the preferred embodiment of the present invention shown in FIG. 1, the bonding bumps 104 comprise a cylindrical section 106 with a first diameter D and a first height h, a conical section 108 with a base diameter CD and a second height H-h, the lateral surfaces of the conical section 108 having an inclination a, and a further cylindrical section 110, which merges with a paraboloid section 112 with a second diameter HD and a third height h'-H-h. The sections described hereinbefore are arranged above each other, so that the bonding bump 104 shown in FIG. 1 results.

In a second method step, a first flexible circuit carrier 114 is arranged on the chip. The first flexible circuit carrier 114 consists of a carrier foil 116 and a bonding area 118, which is implemented in the form of a conducting path metallization, arranged on the carrier foil 116. The carrier foil has a thickness d and the conducting path metallization 118 has a thickness d'.

The flexible circuit carrier includes cavities 120 and 120', which penetrate the carrier foil 116 and the conducting path metallization 118 and which are aligned with the bonding bumps 104 of the chip 100.

Figure 2:
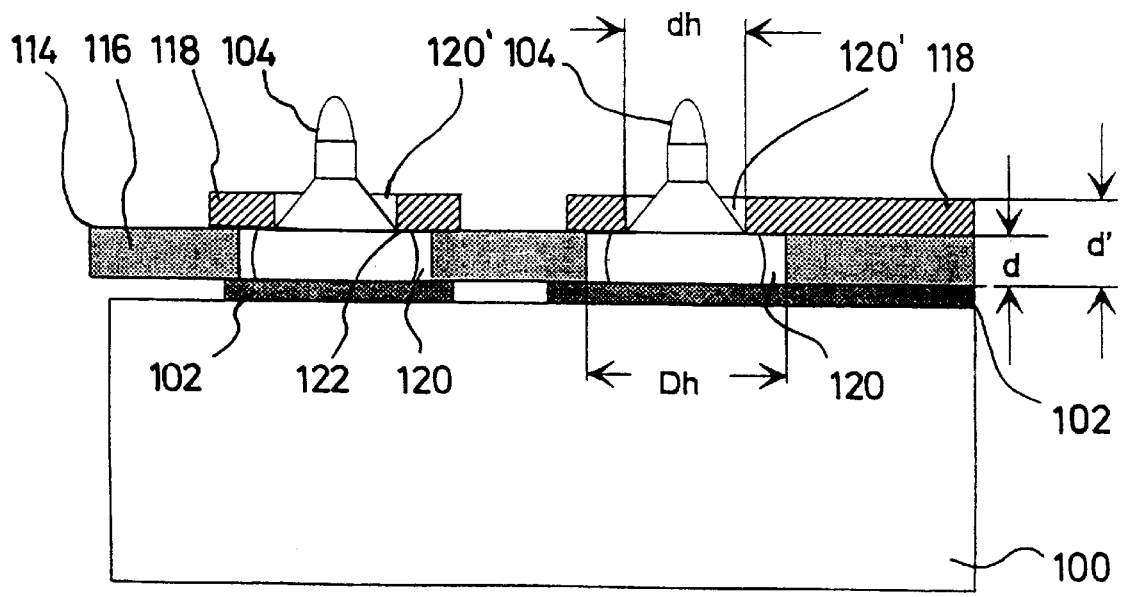
FIG. 2 shows a chip on which a flexible circuit carrier is arranged.

The structure resulting from the second method step is shown in FIG. 2.

As is shown in FIG. 2, the cavity 120 in the carrier foil 116 and the cavity 120' in the conducting path metallization 118 have different diameters Dh, dh in this embodiment. It is obvious that the diameter of the cavity 120 of the carrier foil 116 depends here on the diameter D of the lowest section 106 of the bonding bump 104 and that the diameter of the cavity 120' in the conducting path metallization 118 depends on the diameter CD of the section 108 arranged on the lowest section 106 of the bonding bump 104. In the embodiment shown in FIG. 2, the cavity 120' of the conducting path metallization 118 has been so chosen as to have a diameter corresponding to the diameter of the conical section 108 of the bonding bump 104. In this embodiment there is, between the lowest section 106 and the section 108 located above it, a projection 122 on which the circumference of the cavity 120' rests.

For persons skilled in the art it is obvious that e.g. for manufacturing reasons (e.g. punching of the cavities 120, 120'), cavities of the same size can also be produced, in which case their size need only be matched to the diameter D of the bonding bump 104.

When using a bonding bump 104 consisting of a solder material, the conducting path metallization 118 around the cavities 120' must be provided in addition with a solder material boundary (not shown).

In a third method step, second bonding bumps 124 are applied to the bonding bumps 104. The application of the second bonding bumps 124 takes place in such a way that bonding areas on the first flexible circuit carrier 114, namely the conducting path metallizations 118, are in contact with the second bonding bumps 124 and/or the first bonding bumps 104.

Figure 3:
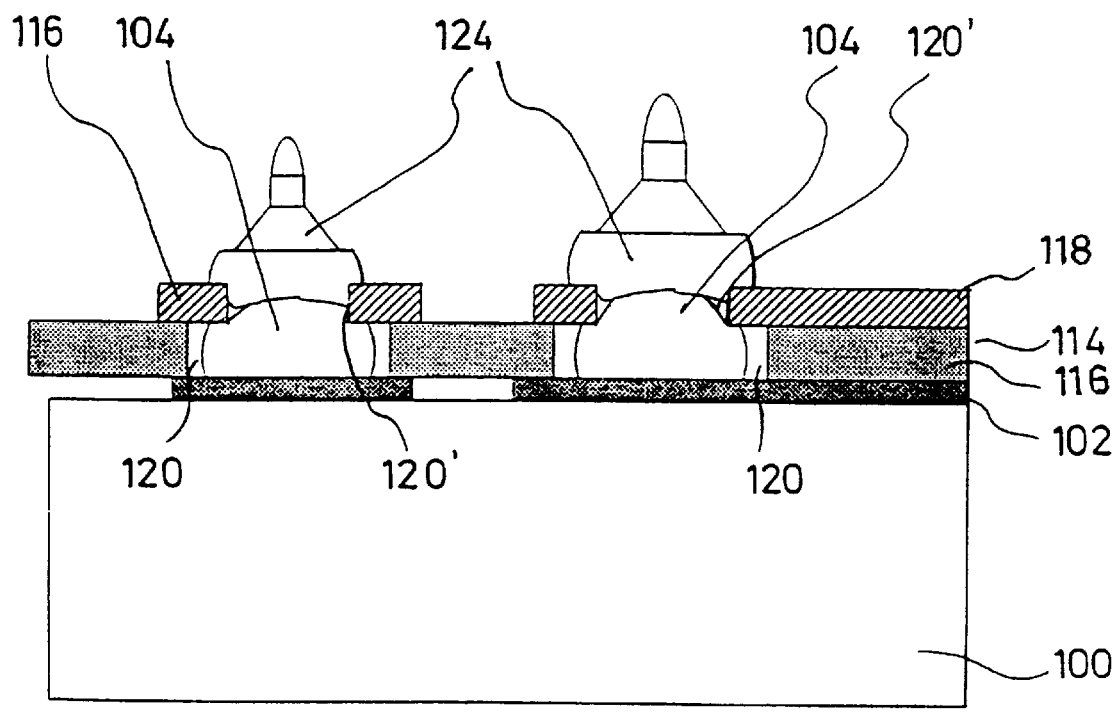
FIG. 3 shows a bonded chip in accordance with the method according to the present invention.

The structure resulting from this method step is shown in FIG. 3.

As may be seen in FIG. 3, the second bonding bumps 124 have essentially the same structure as the bonding bumps 104 according to this embodiment. The geometrical dimensions of the individual second bonding bumps 124 may also differ, however.

The one absolutely necessary requirement in the application of the second bonding bumps 124 is that these connect the conducting path metallizations 118 on the first flexible circuit carrier 114 with the bonding bumps 104, and that a connection of the conducting path metallizations 118 to the bonding electrodes 102 of the chip is thereby established.

According to a further embodiment, not shown, in which the cavities 120, 120' in the carrier foil 116 and in the conducting path metallization 118 are so chosen that they have the same diameter, it is obvious that the second bonding bumps 124 have different dimensions such that the diameter of the second bonding bumps 124 is sufficiently large to bridge the cavity 120, so that a contact between the conducting path metallization 18, the bonding bump 104 and the bonding electrode 102 is securely established.

Figure 4:
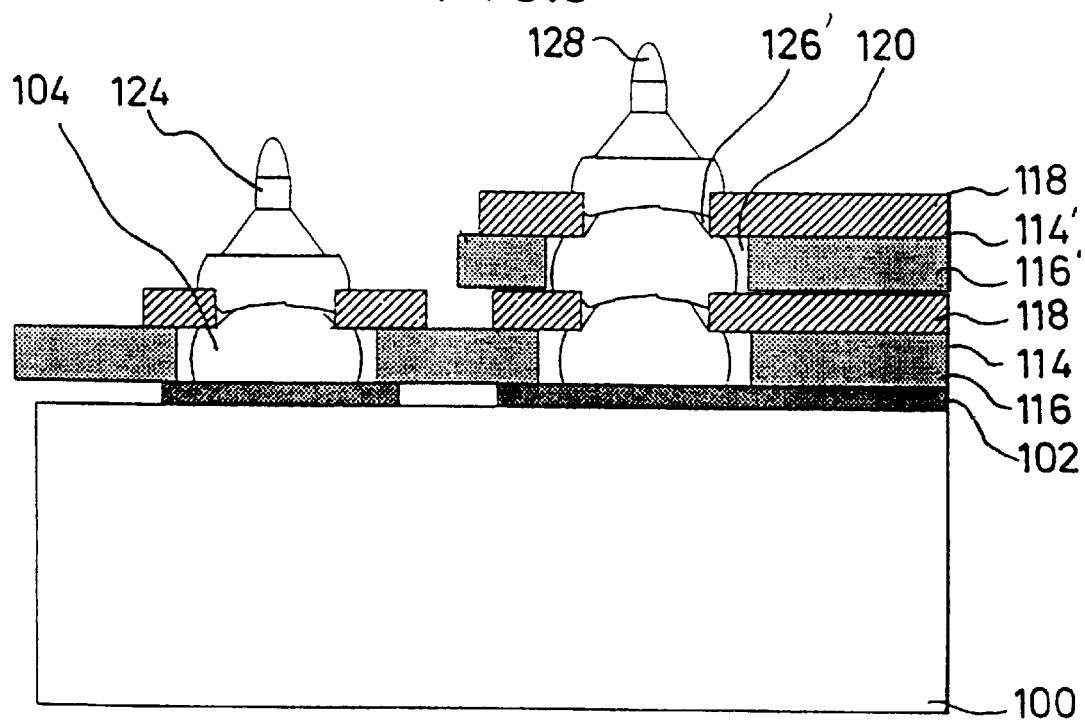
FIG. 4 shows a further embodiment for the chip bonding in accordance with the method according to the present invention.

In FIG. 4 a structure is represented which results according to a further embodiment of the method according to the present invention. After performing the three method steps described above and the resultant bonding of the flexible circuit carrier 114 with the chip 100, the second and third steps are repeated according to this further embodiment, so that a further bonding of a second flexible circuit carrier on the already bonded first circuit carrier 114 results.

As in the case of the second method step described above, in a further method step a second flexible circuit carrier 114', which likewise has a carrier foil 116' and a conducting path metallization 118', is arranged on the first flexible circuit carrier 114. This second flexible circuit carrier 114' likewise has cavities 126 and 126', which are aligned with the second bonding bumps 124, so that in the next step, in which a third bonding bump 128 is applied to the second bonding bump 124, a bonding of the first and second flexible circuit carriers 114, 114', or rather their conducting path metallizations 118, 118', occurs.

In the embodiment shown in FIG. 4, the conducting path metallization 118' of the second flexible circuit carrier 114' is connected to the bonding electrode 102 of the chip 100 via the second bonding bump 124 and the bonding bump 104.

As is clear from FIG. 4, it is not necessary that the second flexible circuit carrier 114' should have the same dimensions as the first flexible circuit carrier 114.

The cavities 126 in the second flexible circuit carrier 114', in particular the cavity 126 in the carrier foil 116' and the cavity 126' in the conducting path metallization, are also subject to the same conditions in terms of their dimensions as those described already on the basis of FIG. 2.

It is obvious to persons skilled in the art that the embodiment of the present invention described on the basis of FIG. 4 is not restricted to the application of two flexible circuit carriers, but that any number of flexible circuit carriers can be arranged on top of each other, the number of circuit carriers depending on the desired circuit configuration.

Furthermore, the embodiment described on the basis of FIG. 4 is not restricted exclusively to through-bonding of the conducting path metallizations to the bonding electrodes of the chip; bonding between the flexible circuit carriers is also possible without there being any through-bonding to the chip.

In the latter case, a bonding bump is arranged at a prescribed place on the first flexible circuit carrier, and the second flexible circuit carrier has additional cavities which are aligned with the bonding bumps on the first flexible circuit carrier. Then the second bonding bumps, which are arranged on the first flexible circuit carrier, have further second bonding bumps applied to them, so that a bond is established between the conducting path metallizations 118, 118' of the first flexible circuit carrier 114 and of the second flexible circuit carrier 114'.

It is obvious to persons skilled in the art that the carrier foils 116, 116' of the flexible circuit carriers are made of a insulating material, thus avoiding a short circuit of the bonding electrodes 102 on the chip or a short circuit of the conducting path metallizations on the various circuit carriers.

What is claimed is:

1. A method for mounting a chip on a flexible circuit carrier, comprising the method steps of:
   a) applying first bonding bumps to bonding electrodes of the chip;
   b) arranging a first flexible circuit carrier, provided with at least one bonding area, on the chip, the flexible circuit carrier having cavities which are aligned with the bonding bumps and which extend through the first flexible circuit carrier and at least one bonding area on the first flexible circuit carrier; and
   c) after step b), applying second bonding bumps to the first bonding bumps such that at least one bonding area on the first flexible circuit carrier is in contact with at least one of the first or second bonding bumps.

2. The method according to claim 1 wherein the method steps b) and c) are performed repeatedly, so that a multilayer structure with a plurality of flexible circuit carriers results.

3. The method according to claim 1 wherein the first bonding bumps comprise a cylindrical section with a diameter and a first height, a conical section with a base diameter and a second height, the conical section having a first inclination of its lateral side, and a further cylindrical section, which merges with a paraboloid section with a second diameter and a third height, these sections being arranged on top of one another.

4. The method according to claim 1 wherein the second bonding bumps have the same structure as the first bonding bumps.

5. The method according to claim 1 wherein the flexible circuit carrier consists of a carrier foil and a bonding area arranged on the carrier foil.

6. The method according to claim 1 wherein the cavities in the flexible circuit carrier have the same dimensions in the carrier foil and in the bonding areas.

7. The method according to claim 1 wherein the cavities in the flexible circuit carrier have different diameters in the carrier foil and in the bonding areas, the size of the cavity of the carrier foil depending on the diameter of the lowest section of the bonding bumps, the size of the cavity in the bonding area depending on the diameter of the section of the bonding bumps arranged on the lowest section of the bonding bumps.

8. The method according to claim 1 wherein in method step c) the second bonding bumps also on the flexible circuit carrier are arranged on its bonding area, so that on applying a second flexible circuit carrier, whose cavities are aligned with the first and second bonding bumps, and on applying third bonding bumps to the second bonding bumps, bonding of the first and of the second flexible circuit carrier occurs.

9. The method according to claim 1 wherein the bonding bumps are made of gold, copper or palladium.

10. The method according to claim 1 wherein the bonding bumps are made of a solder material and wherein the bonding areas have a solder material boundary around the cavities.

11. The method according to claim 10 wherein the solder materials include PbSn, InSn or SnAg.

12. A chip applied to a flexible circuit carrier in accordance with the method according to claim 1, comprising
   at least one chip with bonding electrodes, on which first bonding bumps are arranged;
   a first flexible circuit carrier, having a carrier foil and, arranged on this, at least one a bonding area, with cavities which are aligned with the first bonding bumps, which are arranged on the at least one chip, the cavities extending through the first flexible circuit carrier and the at least one bonding area on the first flexible circuit carrier;
   second bonding bumps which are so applied to the first bonding bumps that at least one bonding area of the first flexible circuit carrier is in contact with the first and/or second bonding bumps.

13. The chip mounted on a flexible circuit carrier according to claim 12 wherein the first flexible circuit carrier has arranged thereon a second flexible circuit carrier having cavities which are aligned with the second bonding bumps, and wherein third bonding bumps are so arranged on the second bonding bumps that a bonding area of the second flexible circuit carrier is in contact with the second bonding bumps.

* * * * *